(12) United States Patent  
Koyama et al.

(10) Patent No.: US 6,382,983 B2  
(45) Date of Patent: May 7, 2002

(54) MODULE MOUNTING SYSTEM

(75) Inventors: Ryozo Koyama; Tsuyoshi Sakata, both of Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/812,998

(22) Filed: Mar. 21, 2001

(30) Foreign Application Priority Data

Mar. 22, 2000 (JP) ........................................ 2000-080171

(51) Int. Cl.[7] .................................................. H01R 9/09

(52) U.S. Cl. .......................................... 439/62; 439/631

(58) Field of Search ........................ 439/62, 74, 540.1, 439/633, 638, 654, 637, 326, 631, 79; 361/777, 788

(56) References Cited

U.S. PATENT DOCUMENTS

| | | | | |
|---|---|---|---|---|
| 5,882,211 A | * | 3/1999 | Choy et al. | 439/74 |
| 5,895,278 A | * | 4/1999 | Humphrey | 439/101 |
| 5,926,378 A | * | 7/1999 | DeWitt et al. | 361/788 |
| 6,011,695 A | * | 1/2000 | Dumke | 361/777 |
| 6,114,997 A | * | 9/2000 | Lee et al. | 343/700 |
| 6,203,338 B1 | * | 3/2001 | Choy | 439/83 |

* cited by examiner

Primary Examiner—Tho D. Ta  
Assistant Examiner—Phuongchi Nguyen  
(74) Attorney, Agent, or Firm—Kanesaka & Takeuchi

(57) ABSTRACT

A module mounting system includes a mother board (1) having a plurality of layers, first and second sockets (2, 3) provided on a face of the mother board (1) such that their rear faces (9, 18) are opposed to each other, and a plurality of wiring patterns (27, 29) provided one for each layer to interconnect the terminals (7, 8, 20, 21) of the first and second sockets (2, 3).

6 Claims, 10 Drawing Sheets

MODULE MOUNTING SYSTEM

BACKGROUND OF THE INVENTION

1. Field of the Invention

The present invention relates to systems for mounting modules and, more particularly, a system for mounting a pair of module boards on a mother board via sockets.

2. Description of the Related Art

There is a need for replacement of module boards in personal computers, office automation equipment, and/or communications equipment. The module boards are mounted on a mother board via sockets into or out of which the module boards are plugged. Usually, a pair of module boards are mounted on a mother board via separate sockets and interconnected by wiring on the mother board.

However, the conventional wiring conductors become very long or crisscross on the mother board.

In order to minimize the length of wiring conductors, sockets are arranged on the mother board such that the respective terminals are opposed to each other. Since the wiring between the module boards is made on the mother board, the wiring pitch is determined by the terminal pitch of the sockets so that the distance between the wiring conductors becomes too small to enhance the electrical characteristics such as impedance match.

SUMMARY OF THE INVENTION

Accordingly, it is an object of the invention to provide a module mounting system capable of minimizing the length of interconnection between module boards and enhancing the electrical characteristics such as impedance match.

According to the invention there is provided a module mounting system for interconnecting first and second module boards to a mother board having a plurality of layers, which comprises a first socket provided on a face of the mother board and having a plurality of first terminals; a second socket having a plurality of second terminals and provided on the face of the mother board such that a second rear face of the second socket is opposed to a first rear face of the first socket; and a plurality of wiring patterns provided on the layers, one for each layer, for interconnecting the first and second terminals of the first and second sockets.

It is preferred that the wiring patterns each have a plurality of wiring conductors that do not cross each other in a plane or tilted plane. The first socket comprises a first slot for receiving the first module board and supporting the first terminals in upper and lower rows and a first key provided toward an end of the first slot. The second socket comprises a second slot for receiving the second module board and supporting the second terminals in upper and lower rows and a second key provided at a position opposed to the first key. The first and second module boards are identical and each having a plurality of terminals and a key notch at positions corresponding to the first and second terminals and key; and the first and second module boards are plugged into the first and second slots in an upside down relation with each other.

The the first and second sockets are identical. The first and second slots receive the first and second module boards, respectively, and each have a plurality of first or second terminals in upper and lower rows and a first or second key toward an end of the first or second slot; the first and second module boards each have a plurality of terminals and a key notch at positions corresponding to the first or second terminals and key; the first and second module boards are plugged into the first and second slots in opposite directions.

According to another aspect of the invention there is provided a module mounting system for interconnecting first and second module boards to a mother board, which comprises a first socket provided on an upper face of the mother board and having a plurality of first terminals; a second socket provided on a lower face of the mother board and having a plurality of second terminals; interconnection means for interconnecting the first and second terminals.

The mother board has a plurality of layers and the interconnection means has a plurality of wiring patterns, one for each of the layers, to interconnect the first and second terminals. The first and second sockets are provided at corresponding positions on opposite faces of the mother board such that the wiring patterns do not cross each other in a plane. The first and second sockets are identical; first and second slots provided in the first and second sockets, respectively, for receiving the first and second module boards, respectively, and the first and second terminals, respectively, in upper and lower rows; first and second keys provided toward an end of the first and second slots, respectively; the first and second sockets are provided on the mother board in an upside down fashion with respect to each other; the first and second module boards are identical and each have a plurality of first or second terminals and a first or second key notch provided at positions correspond to the first or second terminals and key; and the first and second module boards are plugged into the first and second sockets in opposite directions.

The first socket comprises a first slot for receiving the first module board and supporting the first terminals in upper and lower rows; a first key provided toward an end of the first slot. The second socket comprises a second slot for receiving the second module board and supporting the second terminals arranged in an upside down relation with the first terminals; a second key provided toward an end of the second slot. The first and second terminals and keys are opposed to each other on opposite faces of the mother board; the first and second module boards are identical and each have a plurality of terminals and a key notch corresponding to the first or second terminals and key. The first and second terminals of the first and second sockets are opposed to each other on opposite faces of the mother board and which further comprises a plurality of wiring conductors that are perpendicular to the mother board and interconnect the first and second terminals.

With such a structure it is possible to provide the shortest wiring conductors of equal-length without any crossing to interconnect the sockets, thereby improving the electrical characteristics such as impedance match.

DESCRIPTION OF THE PREFERRED EMBODIMENTS

Figure 1:
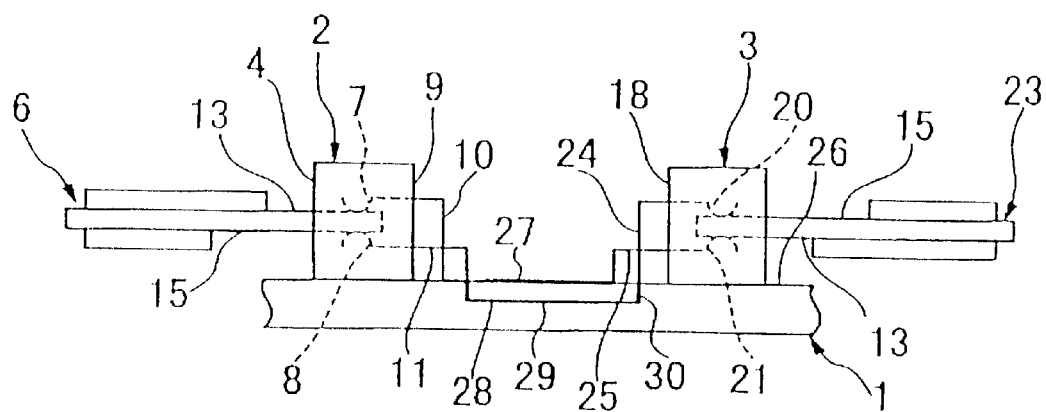
FIG. 1 is a side elevational view of a module mounting system according to a first embodiment of the invention.
Figure 2:
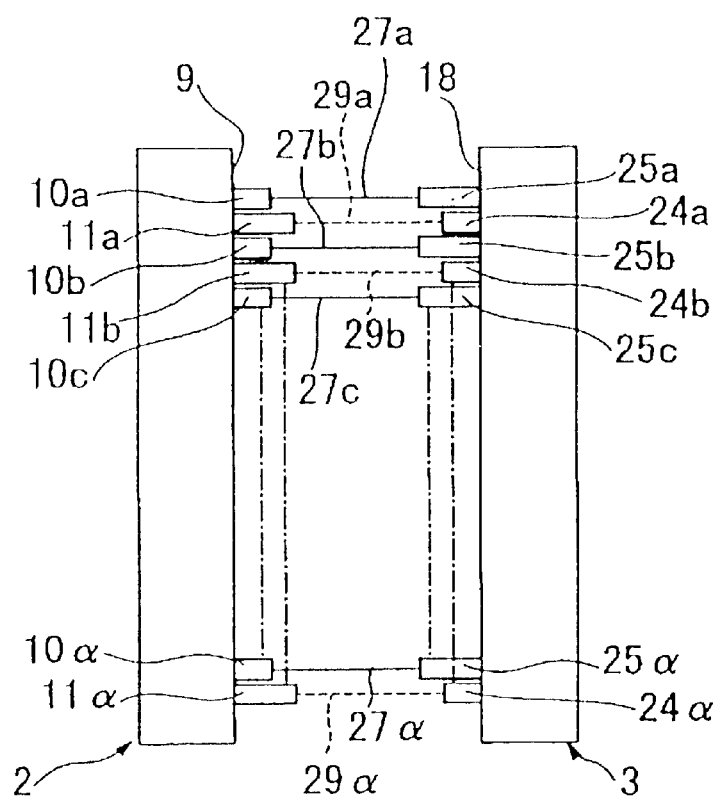
FIG. 2 is a top plan view of a pair of sockets for the module mounting system.
Figure 3:
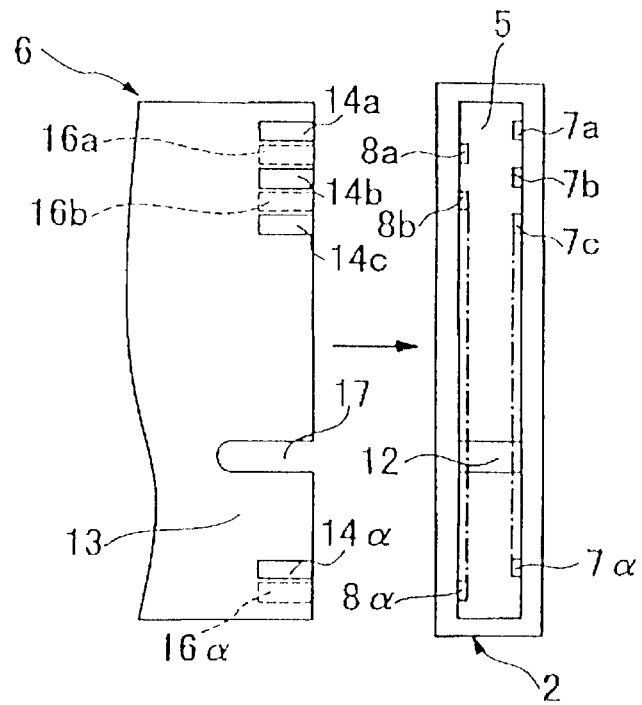
FIG. 3 is an illustration showing a relationship between one of the sockets and a module board for the module mounting system.

Embodiments of the invention will now be described with reference to the accompanying drawings.

In FIGS. 1–4, a first socket 2 and a second socket 3 are mounted on a mother board 1. A first slot 5 is provided in the front face 4 of the first socket 2 for receiving a removable module board 6. A plurality of upper terminals 7 and a plurality of lower terminals 8 are provided in upper and lower rows, respectively, in the first slot 5 with predetermined pitches. In best shown in FIG. 3, the first upper terminals 7 and the first lower terminals 8 are arranged alternately in a zigzag fashion. They have first leads 10 and 11, respectively, extending laterally from the rear face 9 and then downwardly from the lateral sections to the mother board 1. A first key 12 is provided across the first slot 5 toward an end of the first slot 5.

A plurality of first upper-face terminals 14 are arranged on an upper face 13 of the module board 6 with a predetermined pitch corresponding to the first upper terminals 7 while a plurality of first lower-face terminals 16 are arranged on a lower face 15 of the module board 6. A first key notch 17 is provided in the module board 6 at a position corresponding to the first key 12. When the first module board 6 is plugged in the first slot 5, the first key notch 17 engages the first key 12 so that the first upper and lower terminals 7 and 8 are brought into contact with the first upper-face and lower-face terminals 14 and 16, respectively.

Figure 4:
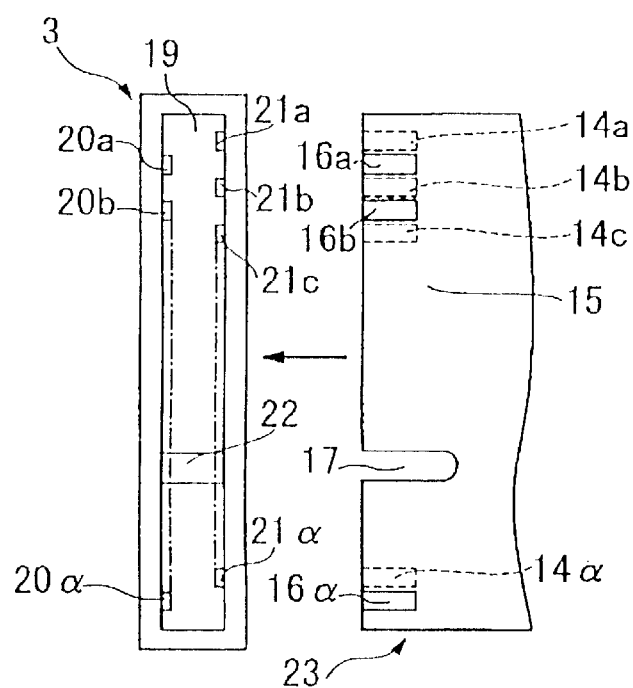
FIG. 4 is an illustration showing a relationship between the other socket and another module board for the module mounting system.

The second socket 3 has a terminal arrangement that is upside down of the terminal arrangement of the first socket 2. It is mounted such that the rear face 18 is opposed to the rear face 9 of the first socket 2. Similarly to the first socket 2, it has a second slot 19, second upper terminals 20, second lower terminals 21, and a second key 22. A removable module board 23 is plugged into the second slot 19. As best shown in FIG. 4, the second upper and lower terminals 20 and 21 are arranged alternately in a zigzag fashion. They have second leads 24 and 25 that extend laterally from the rear face 18 and then downwardly to the mother board 1. Consequently, the first lead 10a, 11a, 10b, 11b, 10c, . . . and the first key 12 correspond to the second lead 25a, 24a, 25b, 24b, 24c, 25c, . . . and the second key 22, respectively.

The second module board 23 is identical with the first module board 6 so that the first modular board 6 can be plugged into the second slot 19 by turning it upside down. Thus, a single type of module boards can be used for both of the module boards 6 and 23, leading to the cost saving.

The mother board has a structure of multiple layers that are separated by insulators. A first wiring pattern 27 is provided on the upper layer 26 while a second wiring pattern 29 is on an intermediate layer 28. The first and second leads 10 and 25 are connected to the first wiring pattern 27 so that the first leads 10a, 10b, 10c, . . . and the second leads 25a, 25b, 25c, . . . are interconnected by the first wiring conductors 27a, 27b, 27c, . . . , respectively. The first and second leads 11a, 11b, . . . and 24a, 24b, . . . are interconnected by the second wiring conductors 29a, 29b, . . . respectively, via viaholes 30.

The first leads 10 and 11 correspond to the second leads 11 and 25 in upper and lower planes, respectively, so that the first and second wiring conductors 27 and 29 become straight parallel lines of equal length and do not cross each other, thereby making the shortest interconnection possible and enhancing the electrical characteristics such as impedance match. The first and second wiring conductors 27 and 29 are arranged in zigzag fashion in the upper and intermediate layers 26 and 28, respectively, so that the distance between the wiring conductors in the same layer becomes sufficiently large to reduce the crosstalk between the wiring conductors on the same layer.

Figure 5:
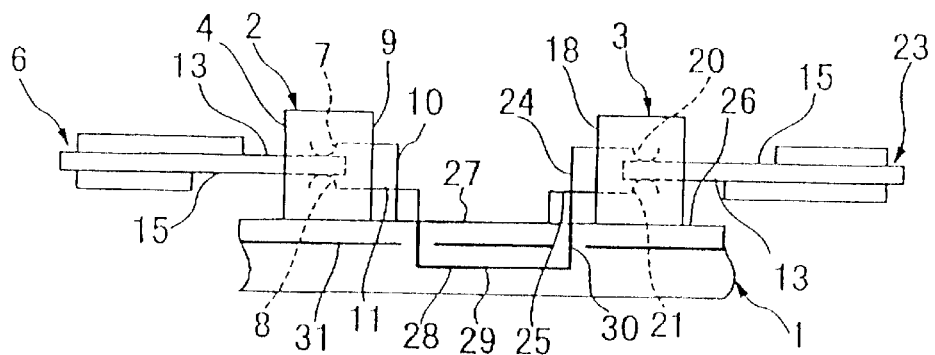
FIG. 5 is a side elevational view of a first modification to the first embodiment.

In FIG. 5, a ground layer 31 is provided between the upper layer 27 and the intermediate layer 28 to further reduce the crosstalk between the layers.

Figure 6:
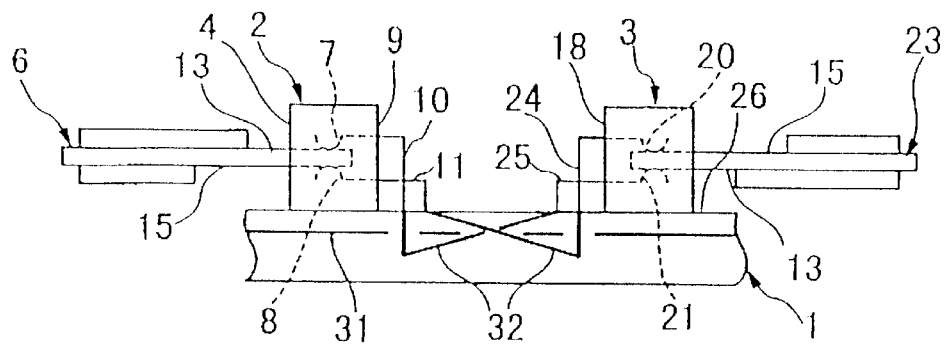
FIG. 6 is a side elevational view of a second modification to the first embodiment.

In FIG. 6, there is provided an inclined wiring pattern 32. The number of layers in the mother board 1 may vary.

Figure 7:
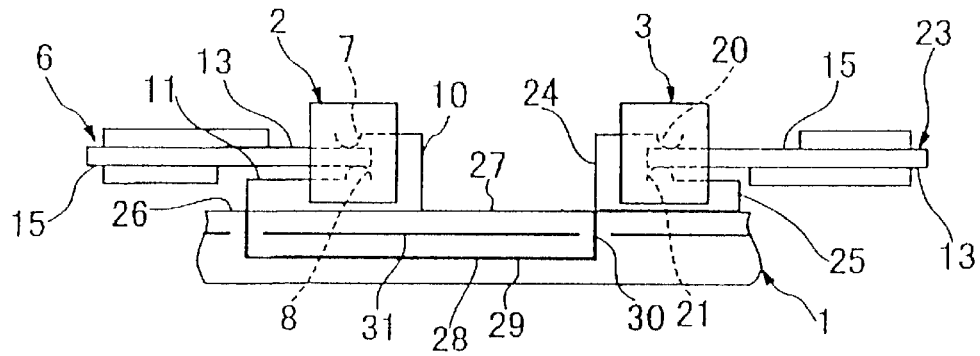
FIG. 7 is a side elevational view of a third modification to the first embodiment.
Figure 8:
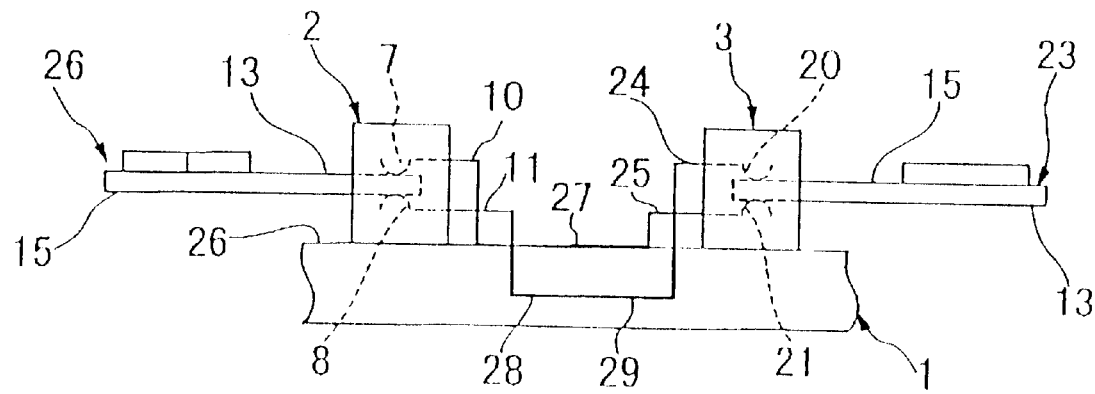
FIG. 8 is a side elevational view of a module mounting system according to a fourth modification to the first embodiment of the invention.
Figure 9:
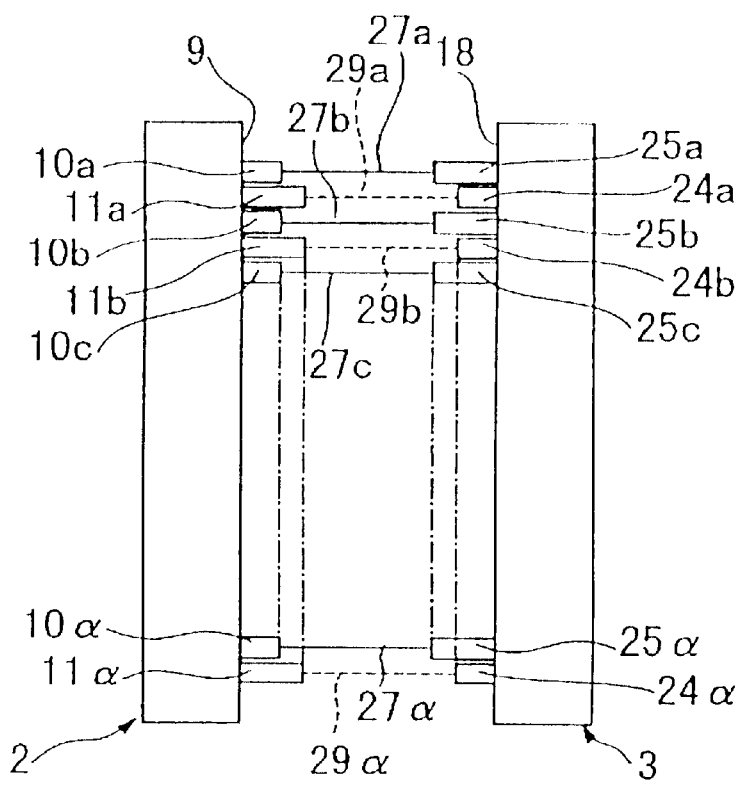
FIG. 9 is a top plan view of a pair of sockets for the fourth modification.
Figure 10:
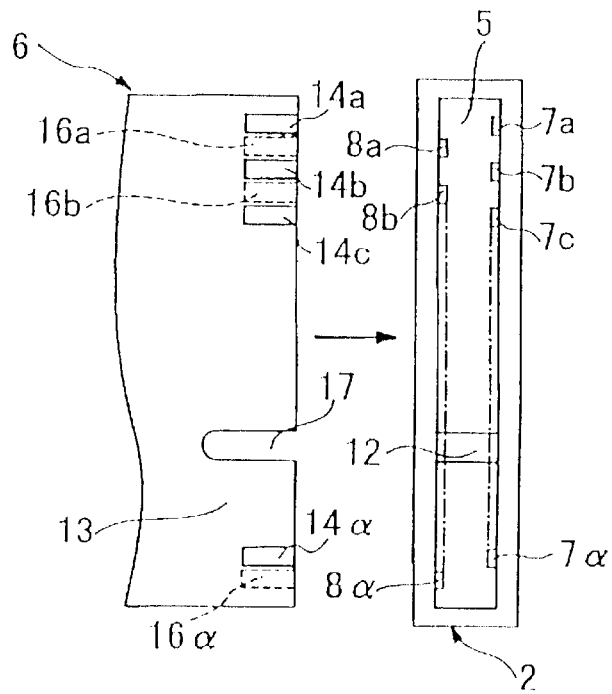
FIG. 10 is an illustration showing a relationship between one of the sockets of FIG. 9 and a modular board.
Figure 11:
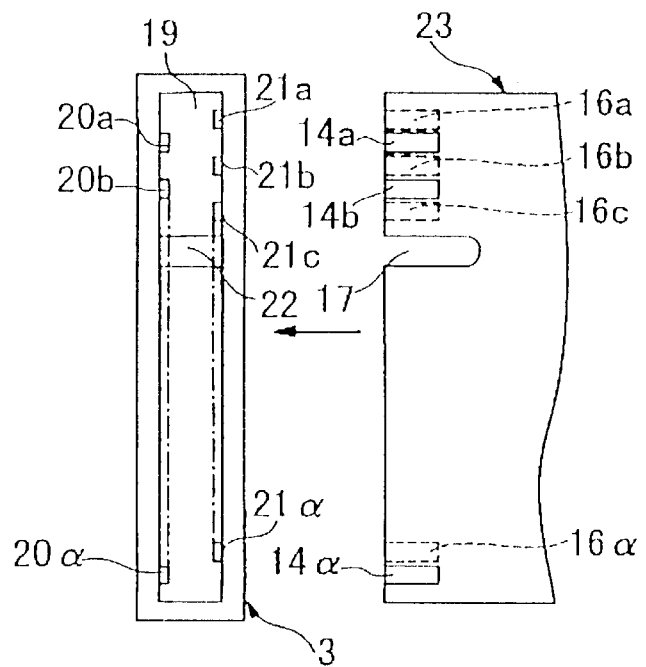
FIG. 11 is an illustration showing a relationship between the other socket of FIG. 9 and another modular board.

In FIG. 7, the leads 10 and 24 of the upper terminals 7 and 20 and the leads 11 and 25 of the lower terminals 8 and 21 are taken out of the front and rear faces of the sockets 2 and 3, respectively.

In FIGS. 8–11, the second socket 3 is identical with the first socket 2, and first and second module boards 26 and 23 are made so as to have the terminals and key configuration of the first and second sockets 2 and 3, respectively. In this embodiment, a single type of sockets serve as the first and second sockets 2 and 3, leading to the cost saving.

Figure 12:
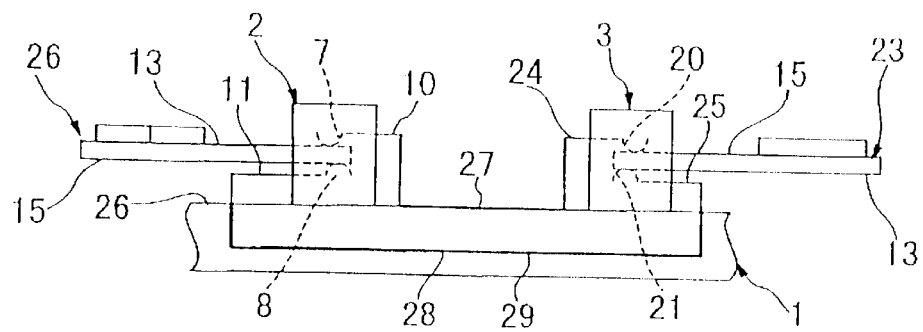
FIG. 12 is a side elevational view of a fifth modification to the first embodiment.

In FIG. 12, wherein the first and second sockets 2 and 3 are identical, the leads 10 and 24 of the upper terminals 7 and 20 and the leads 11 and 25 of the lower terminals 8 and 21 are taken out of the front and rear faces of the sockets 2 and 3, respectively.

Figure 13:
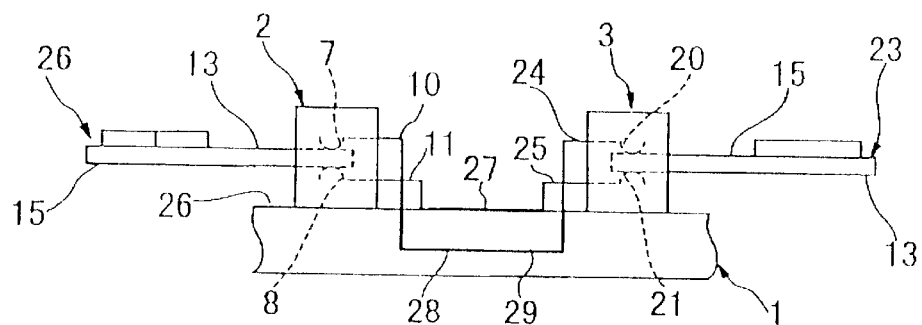
FIG. 13 is a side elevational view of a sixth modification to the first embodiment.
Figure 14:
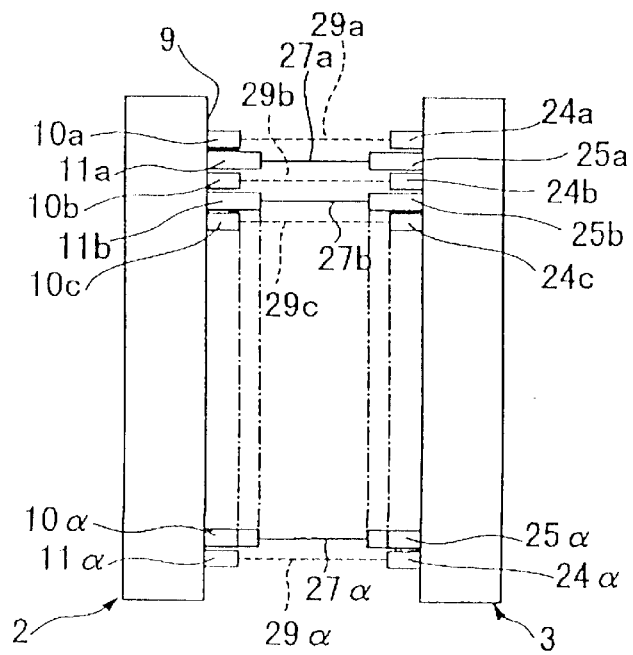
FIG. 14 is a top plan view of a pair of sockets for the sixth modification.
Figure 15:
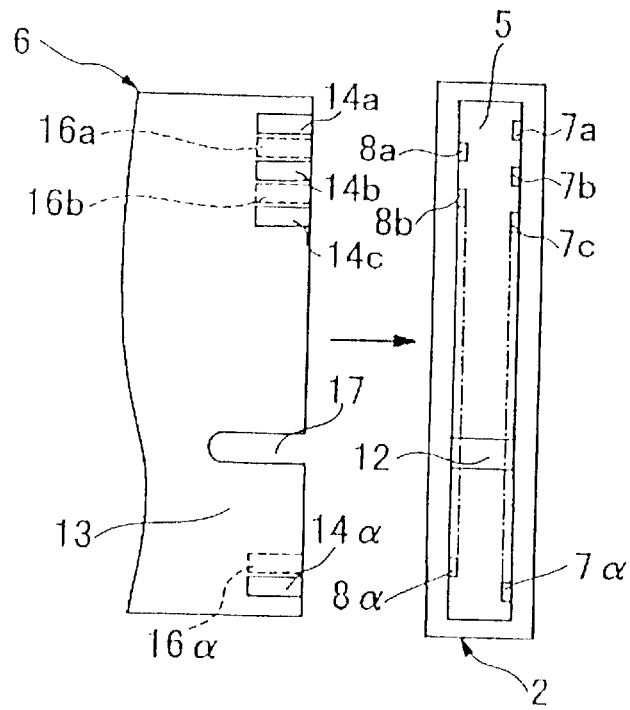
FIG. 15 is an illustration showing one of the sockets of FIG. 14 and a modular board.
Figure 16:
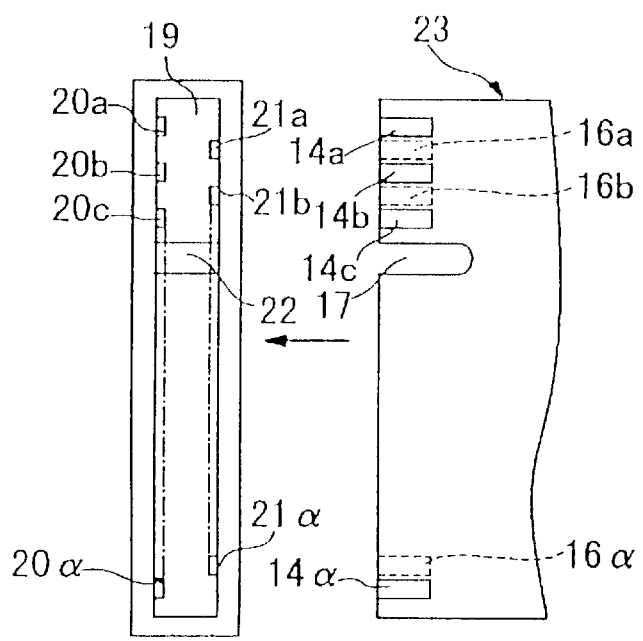
FIG. 16 is an illustration showing the other socket of FIG. 14 and another board.
Figure 17:
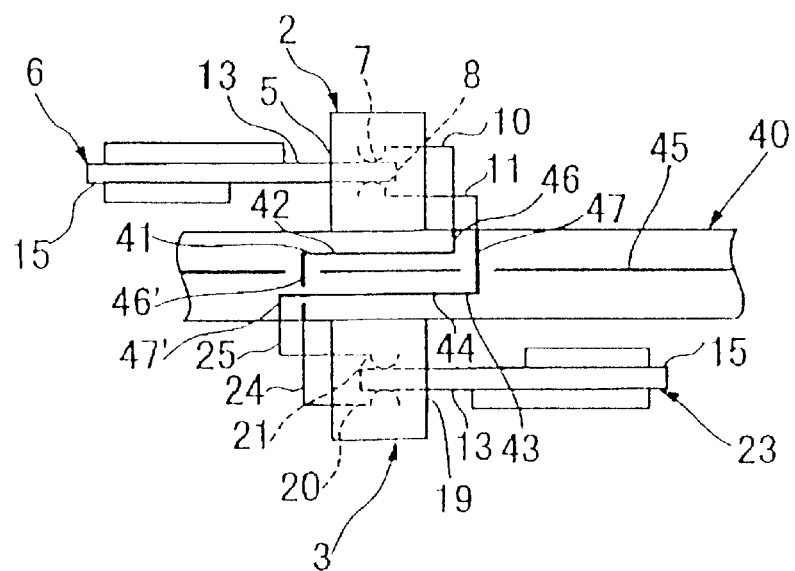
FIG. 17 is a side elevational view of a module mounting system according to the second embodiment of the invention.

In FIGS. 13–16, the upper terminals 7 and 20 are provided one more than the lower terminals 8 and 21, respectively. As best shown in FIG. 13, the first upper and lower terminals 7 and 8 are interconnected to the second upper and lower terminals 20 and 21, respectively.

In FIGS. 17–22, like components are assigned with the same reference numerals as those of FIGS. 1–16 and their detailed description is omitted.

The first and second sockets 2 and 3 are identical with each other and are mounted on the upper and lower faces of a mother board 40, respectively, such that the first and second slots 5 and 9 face in opposite directions.

The first and second module boards 6 and 23 are identical with each other and are plugged into the first and second slots 5 and 19, respectively, under the upside down conditions.

The mother board 40 has a structure of multiple layers that are separated by insulators. The first and second wiring patterns 42 and 44 are provided on the first and second intermediate layers 41 and 43, respectively. A ground layer 45 is provided between the first and second intermediate layers 41 and 43. The first and second leads 10, 11 and 24, 25 are interconnected to the first and second wiring patterns 42 and 44 via the first and second viaholes 46 and 46', respectively.

The leads to be interconnected are arranged in the same order in a plane so that the first and second wiring patters 42 and 44 do not cross each other in the plane, thereby reducing the wiring distance and enhancing the electrical characteristics such as impedance match. The first and second wiring patterns 42 and 44 are arranged in alternately on the first and second intermediate layers 41 and 43 so that the distance between the wiring pattern in the same layer becomes sufficiently large to reduce the crosstalk between the wiring patterns on the same layer. In addition, the individual layers are separated by the insulators and ground layer 45 so that it is possible to reduce the crosstalk between the respective layers.

Figure 18:
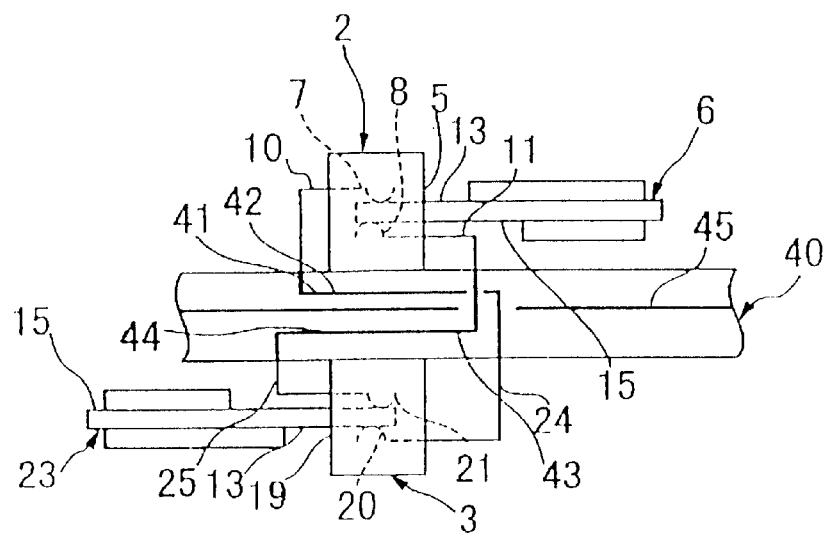
FIG. 18 is a side elevational view of a first modification to the second embodiment.

In FIG. 18, the leads 10, 11, 24, and 25 are distributed to the front and rear faces of the sockets 2 and 3. The number of layers in the mother board 40 may vary.

Figure 19:
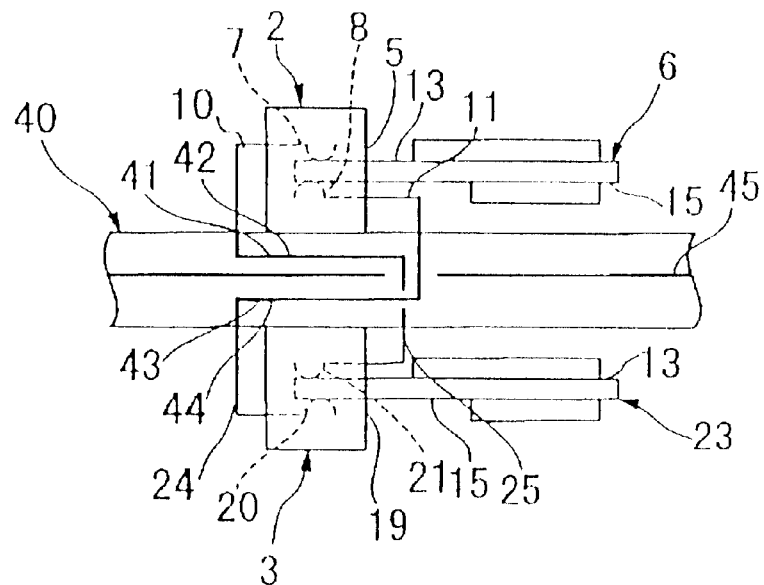
FIG. 19 is a side elevational view of a second modification to the second embodiment.
Figure 20:
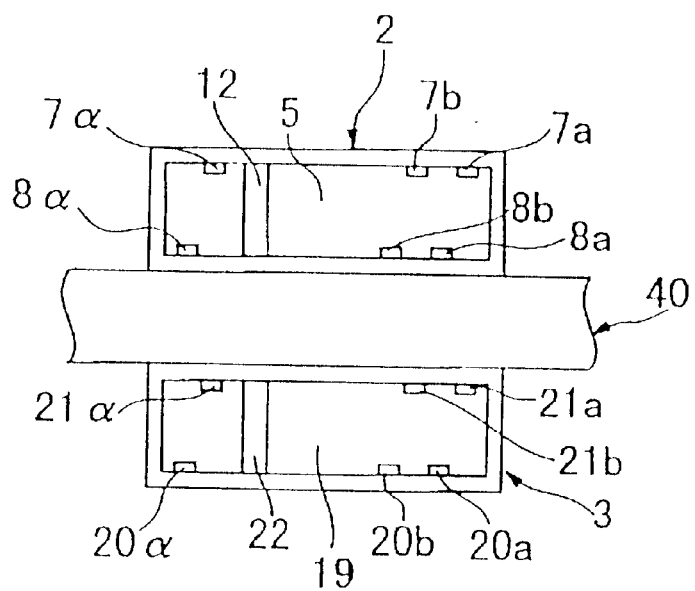
FIG. 20 is a front elevational view of a pair of sockets for the second modification of FIG. 19.

In FIGS. 19 and 20, the second terminals 20 and 21 of the second socket 3 are arranged in a mirror image of the first terminals 7 and 8 with respect to the mother board, and the second key 22 is provided toward either end of the second slot 19 such that the second terminals 20 and 21 and the second key 22 are opposed to the first terminals 7 and 8 and the first key 12 via the mother board 40. The first and second module boards 6 and 23 are identical so that they can be plugged into the first and second slots 5 and 9 of the first and second sockets 2 and 3. Thus, a single type of module boards are used for the first and second module boards 6 and 23, thereby reducing the cost.

Figure 21:
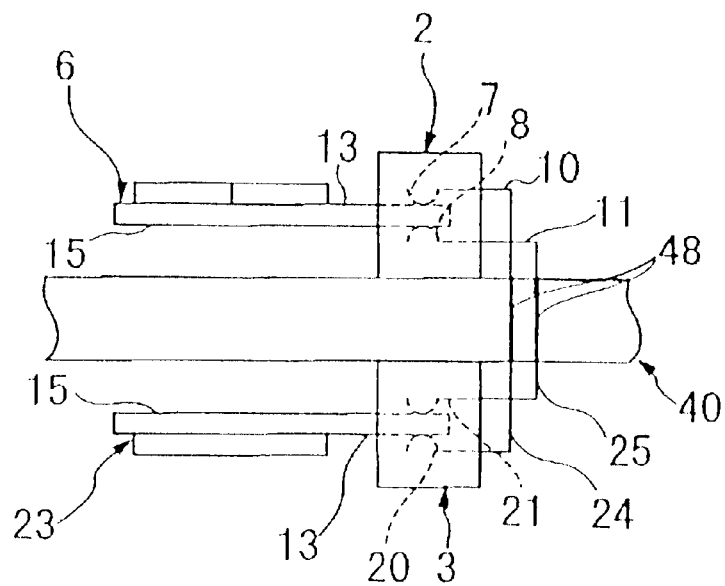
FIGS. 21–22 are side elevational views of third and fourth modifications to the second embodiment.
Figure 22:
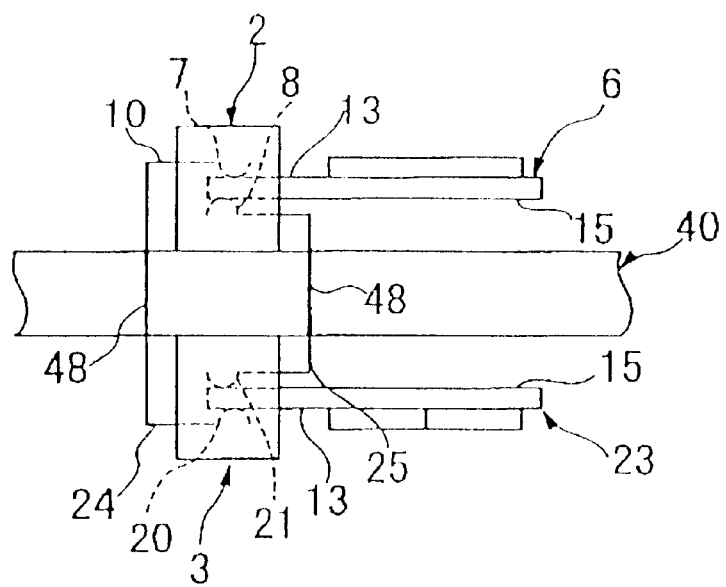

In FIGS. 21 and 22, the respective terminals 7, 8, 20, and 24 are arranged such that the leads 10, 11, 24, and 25 of the first and second sockets 2 and 3 are opposed to each other via the mother board 40. This makes it possible to provide the wiring 48 between the first leads 10 and 11 and the second leads 24 and 25 at right angles with the mother board 40. The wiring becomes straight without crossing, minimizing the wiring distance and enhancing the electrical characteristics such as impedance match. As best shown in FIG. 22, the leads 10, 11, 24, and 25 are distributed to the front and rear faces of the sockets 2 and 3 so that the distance between the wiring conductors 48 is increased, thereby further reducing the crosstalk between the wiring conductors 48 and enhancing the electrical characteristics.

As has been described, according to the invention, the interconnection between the sockets is made in a plane or vertical direction so that the wiring pitch can be made large regardless of the arranging pitch of socket terminals. As a result, the electrical characteristics, such as impedance match, are enhanced. In addition, the wiring conductors do not cross and the wiring length is minimized and made equal.

What is claimed is:

1. A module mounting system for interconnecting first and second module boards to a mother board having a plurality of layers, comprising:
   a first socket provided on a face of said mother board and having a plurality of first terminals;
   a second socket having a plurality of second terminals and provided on said face of said mother board such that a second rear face of said second socket is opposed to a first rear face of said first socket;
   a plurality of wiring patterns provided on said layers, one for each of said layers, each wiring pattern having a plurality of wiring conductors which extend straight in parallel with each other and do not cross each other for interconnecting said first and second terminals of said first and second sockets in the shortest wiring line, and are arranged in a zigzag fashion in said layers; and
   a plurality of ground layers, each provided between adjacent two of said layers.

2. The module mounting system according to claim 1, wherein said first socket comprises:
   a first slot for receiving said first module board and supporting said first terminals in upper and lower rows and
   a first key provided toward an end of said first slot; said second socket comprises:
   a second slot for receiving said second module board and supporting said second terminals in upper and lower rows and
   a second key provided at a position opposed to said first key;
   said first and second module boards are identical and each having a plurality of face terminals and a key notch at positions corresponding to said first and second terminals and said first and second keys; and
   said first and second module boards are plugged into said first and second slots in an upside down relation with each other.

3. The module mounting system according to claim 1, wherein said first and second sockets are identical and comprise first and second slots for receiving said first and second module boards, respectively, and each having a plurality of first or second terminals in upper and lower rows and a first or second key toward an end of said first or second slot;
   each of said first and second module boards has a plurality of face terminals and a key notch at positions corresponding to said first or second terminals and said first or second key; and
   said first and second module boards are plugged into said first and second slots in opposite directions.

4. A module mounting system for interconnecting first and second module boards to a mother board having a plurality of layers, comprising:
   a first socket provided on an upper face of said mother board and having a plurality of first terminals;
   a second socket provided on a lower face of said mother board and having a plurality of second terminals;
   interconnection means for interconnecting said first and second terminals, said interconnection means having a plurality of wiring patterns arranged alternately on said layers; and
   a plurality of ground layers, each provided between each adjacent two of said layers, wherein said first and second sockets are provided at corresponding positions on opposite faces of said mother board such that said wiring patterns do not cross each other.

5. The modular mounting system according to claim 4, wherein said first and second sockets are identical and comprise first and second slots provided in said first and second sockets, respectively, for receiving said first and second module boards, respectively, said first and second terminals, respectively, in upper and lower rows and first and second keys provided toward an end of said first and second slots, respectively;

said fist and second sockets are provided on said mother board in an upside down fashion with respect to each other;

said first and second module boards are identical and each has a plurality of first or second face terminals and a first or second key notch provided at positions corresponding to said first or second terminals and said first or second key; and said first and second module boards are plugged into said first and second sockets in opposite directions.

6. The module mounting system according to claim 4, said first socket comprises:

a first slot for receiving said first module board and supporting said first terminals in upper and lower rows;

a first key provided toward an end of said first slot; said second socket comprises:

a second slot for receiving said second module board and supporting said second terminals arranged in an upside down relation with said first terminals;

a second key provided toward an end of said second slot;

said first and second terminals and keys are opposed to each other on opposite faces of said mother board;

said first and second module boards are identical and each has a plurality of terminals and a key notch corresponding to said first or second terminals and said first and second keys.

\* \* \* \* \*